United States Patent
Hashimoto (10) Patent No.: US 8,084,287 B2
(45) Date of Patent: Dec. 27, 2011

(54) PHOTOELECTRIC CONVERSION APPARATUS, PRODUCING METHOD THEREFOR, IMAGE PICKUP MODULE AND IMAGE PICKUP SYSTEM

(75) Inventor: Sakae Hashimoto, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/981,645

(22) Filed: Dec. 30, 2010

(65) Prior Publication Data

US 2011/0097838 A1    Apr. 28, 2011

Related U.S. Application Data

(62) Division of application No. 11/612,229, filed on Dec. 18, 2006, now Pat. No. 7,884,434.

(30) Foreign Application Priority Data

Dec. 19, 2005  (JP) ................................. 2005-365006

(51) Int. Cl.
    *H01L 21/00* (2006.01)
(52) U.S. Cl. .................................. 438/66; 257/E27.133
(58) Field of Classification Search .................. 438/60, 438/66, 72, 75, 144; 257/E31.075, E31.076, 257/E31.078, E31.079, E31.081, E31.084, 257/E27.133
    See application file for complete search history.

(56) References Cited

U.S. PATENT DOCUMENTS

| 4,731,665 A | 3/1988 | Hashimoto et al. | 358/213.27 |
|---|---|---|---|
| 4,816,910 A | 3/1989 | Hashimoto et al. | 358/213.27 |
| 4,959,723 A | 9/1990 | Hashimoto | 358/213.11 |
| 4,962,412 A | 10/1990 | Shinohara et al. | 357/30 |
| 5,051,831 A | 9/1991 | Hashimoto | 358/213.11 |
| 5,060,042 A | 10/1991 | Shinohara et al. | 357/30 |
| 5,146,339 A | 9/1992 | Shinohara et al. | 358/212 |
| 5,283,428 A | 2/1994 | Morishita et al. | 250/214.1 |
| 7,019,373 B2 | 3/2006 | Hashimoto | 257/432 |
| 2004/0140564 A1* | 7/2004 | Lee et al. | 257/758 |
| 2005/0116269 A1 | 6/2005 | Yokozawa | 257/291 |
| 2005/0236553 A1* | 10/2005 | Noto et al. | 250/208.1 |
| 2006/0038209 A1 | 2/2006 | Hashimoto | 257/294 |
| 2006/0115230 A1* | 6/2006 | Komoguchi et al. | 385/146 |
| 2006/0138577 A1 | 6/2006 | Hashimoto | 257/432 |
| 2006/0141789 A1* | 6/2006 | Kido | 438/689 |
| 2006/0172450 A1 | 8/2006 | Tazoe et al. | 438/57 |

FOREIGN PATENT DOCUMENTS

| JP | 2003-224249 A | 4/1994 |
|---|---|---|
| JP | 06-118208 A | 8/2003 |
| JP | 2004-221532 A | 8/2004 |
| WO | WO 2004/055898 A1 | 7/2004 |

\* cited by examiner

*Primary Examiner* — Brook Kebede (74) *Attorney, Agent, or Firm* — Fitzpatrick, Cella, Harper & Scinto (57) ABSTRACT

A photoelectric conversion apparatus has a plurality of photoelectric conversion elements arranged on a semiconductor substrate, a plurality of wiring layers arranged on the semiconductor substrate through the first and second insulation layers, and a high refractive index region which is arranged in an opening part that is arranged in the interlayer insulation layer so as to correspond to the photoelectric conversion element and has a higher refractive index than the interlayer insulation layers, wherein an area of a cross section parallel to a photoreceiving plane of the photoelectric conversion element in the high refractive index region increases as the position approaches to an upper part of the substrate from a photoreceiving plane of the photoelectric conversion element, namely, as the position approaches to a light-incident plane, and the increasing rate continuously increases with the increase of the area.

14 Claims, 11 Drawing Sheets

PRIOR ART

ND IMAGE PICKUP SYSTEM

CROSS REFERENCE TO RELATED APPLICATION

This application is a division of U.S. application Ser. No. 11/612,229, filed on Dec. 18, 2006, the entire disclosure of which is hereby incorporated by reference herein.

BACKGROUND OF THE INVENTION

1. Field of the Invention

The present invention relates to a photoelectric conversion apparatus, and particularly relates to a condensing portion thereof and a production method therefor.

2. Description of the Related Art

Pixels in a photoelectric conversion apparatus to be used in a digital camera and a camcorder have been fined down, as the photoelectric conversion apparatus is miniaturized and has the more number of the pixels arranged therein. Along with the tendency, an area of its light receiving portion decreases, and consequently lowers its sensitivity, because of decreasing the quantity of a light incident on the light receiving portion as well.

In order to improve the lowering state of the sensitivity, an on-chip micro lens is formed above a light receiving portion of a photoelectric conversion apparatus to condense the light onto a light receiving portion and to inhibit the sensitivity from lowering. Furthermore, in recent years, a structure has been known which has an optical waveguide that makes use of the reflection of the light formed between the on-chip micro lens and a photoelectric conversion element.

A method for producing an optical waveguide in such a photoelectric conversion apparatus generally includes the steps of: forming a well-shaped structure in an insulation layer; and filling the well-shaped structure with a certain substance. The well-shaped structure is filled with a material having a refractive index higher than that of the insulation layer to form a high refractive index region. Then, the optical waveguide is formed in which incident light is reflected on an interface between the insulation layer and the high refractive index region due to a difference between their refractive indices and is condensed into the photoelectric conversion element.

However, as pixels are fined down, an aspect ratio of a well-shaped structure increases, which occasionally leads to the formation of a void in a well in a filling step.

Figure 5:
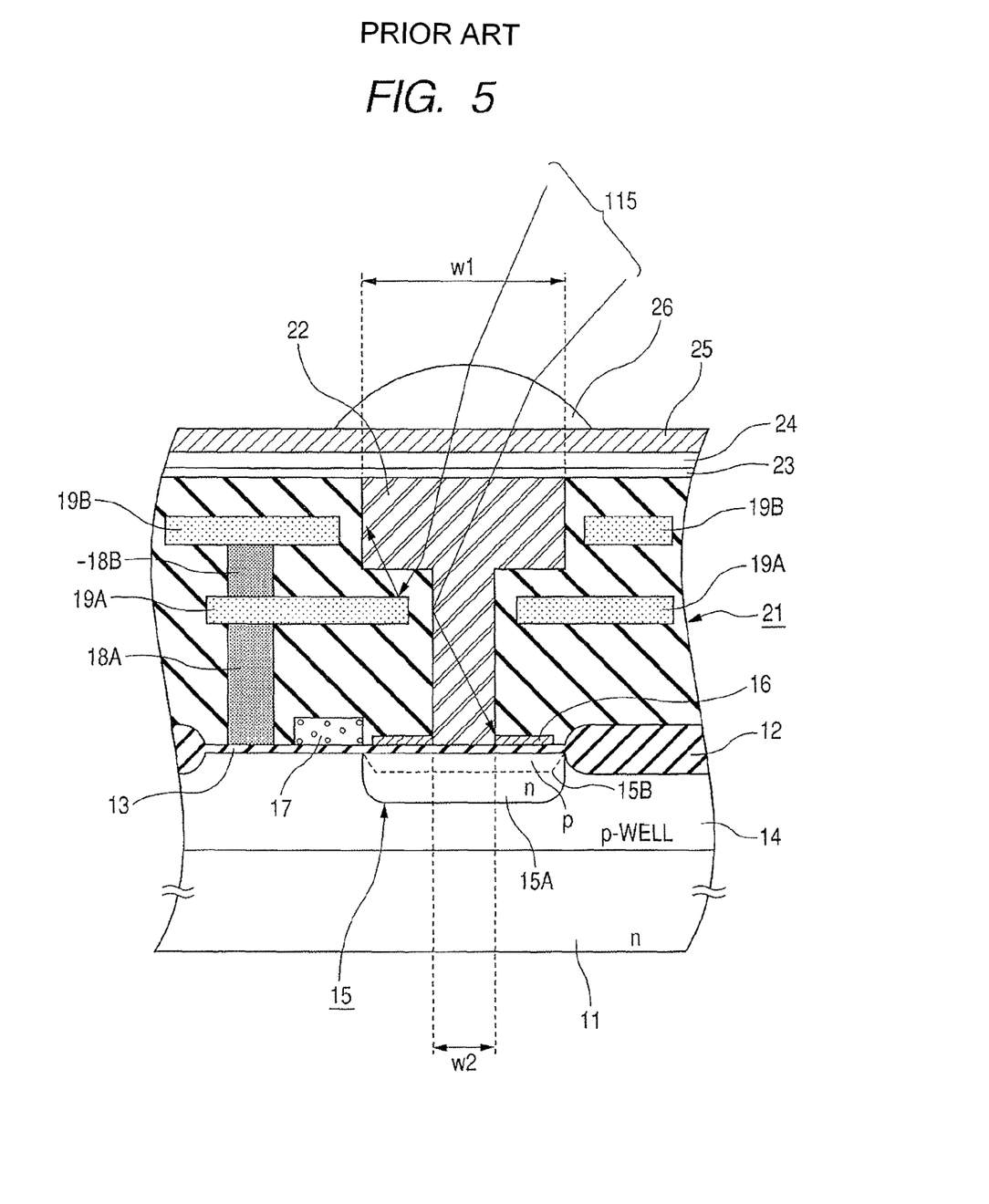
FIG. 5 is a sectional view of a photoelectric conversion apparatus described in a background art.

A technology as shown in FIG. 5 is described in Japanese Patent Application Laid-Open No. 2003-224249, as a means for solving the problem in a filling step.

In a photoelectric conversion apparatus shown in the FIG. 5, reference numeral 11 denotes a silicon substrate and reference numeral 15 denotes a photodiode arranged on the substrate 11. Furthermore, reference numeral 12 denotes a field-insulating film arranged between adjacent photodiodes 15. There arranged above them are an interlayer insulation film 21 and a SiN film 16 having a function of an etching-stop layer for stopping etching in the step of forming an opening part of interlayer insulation film 21. An optical waveguide 22 filled with a transparent film is further arranged in the opening part of the interlayer insulation film 21. In addition, a gate electrode 17, electroconductive plugs 18A and 18B and wires 19A and 19B are respectively arranged.

In a photoelectric conversion apparatus shown in the FIG. 5, a transparent film is filled in opening parts with different sizes w1 and w2, which have been formed in an interlayer insulation film 21. The opening part are formed so that the size of the opening part in the interlayer insulation film 21 increases as the position photodiode is separated from, which can improve the filling easiness.

Figure 6A:
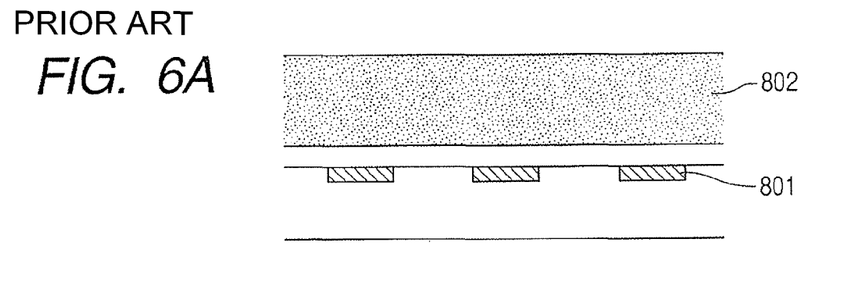
FIGS. 6A, 6B, 6C and 6D are sectional views of a microcondensing plate described in a background art.
Figure 6B:
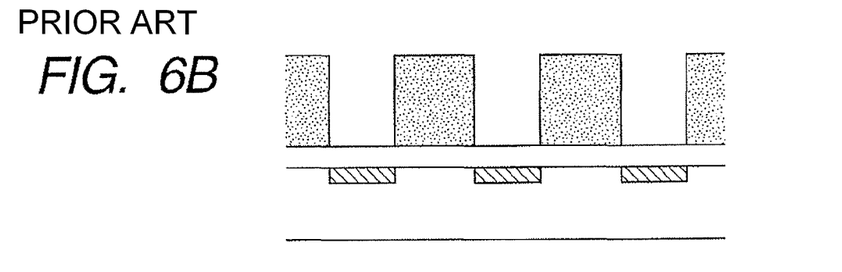
Figure 6C:
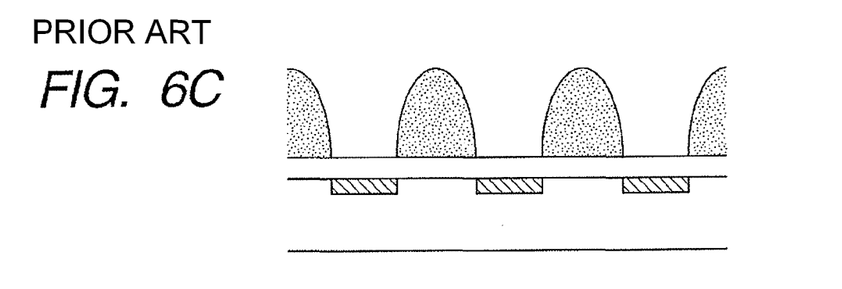
Figure 6D:
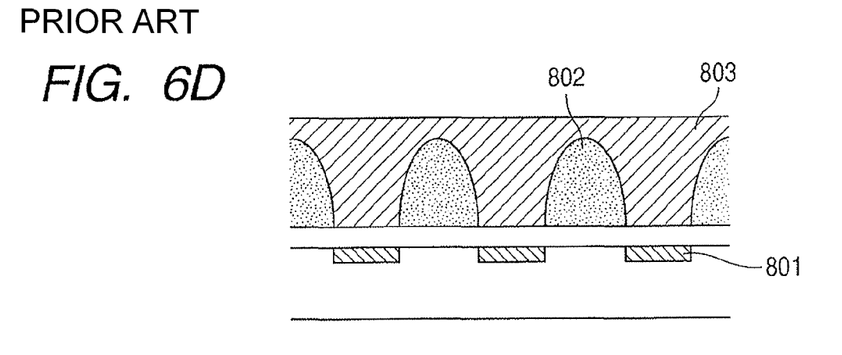

In addition, there is a micro-condensing plate shown in FIG. 6D described in Japanese Patent Application Laid-Open No. H06-118208. The production method is shown in FIGS. 6A, 6B, 6C and 6D. In FIGS. 6A, 6B, 6C and 6D, reference numeral 801 denotes a photoreceiving element, reference numeral 802 denotes a photoresist and reference numeral 803 denotes a high refractive index region, which is higher than the refractive index region of the photo resist 802. The method for producing the condensing plate includes the steps of: applying polymethyl methacrylate of the photoresist 802 on the photoreceiving element 801; patterning it; heating the patterned photoresist to deform it into such a shape as is shown in FIG. 6C; applying polyethylene terephthalate of the high refractive index region 803; planarizing it to form the micro-condensing plate.

However, in FIG. 5, there may be such a light as is shown by an incident light 115 that can not enter into a lower part of an optical waveguide of which the opening width is prescribed as w2 in an interlayer insulation film 21, in a plurality of optical waveguides 22, which may cause the lowering of sensitivity. The light which has not been incident on the photodiode 15 passes through an interface between an insulation film 21 and the optical waveguide 22, is incident on a wire 19 and/or a plug part 18; and reflects on them to possibly cause color mixture and noise. In addition, the light which has not been incident on the optical waveguide 22 but incident on the upper part of the wire 19B reflects on the wire 19B and/or the insulation film 21 to possibly cause the color mixture and the noise.

Furthermore, when pixels in photoelectric conversion apparatus of FIG. 5 are more fined down, it is conceivable that a difference between opening widths w1 and w2 will increase according to the arrangement of a wiring layer 19, which further decreases an amount of incident light.

On the hand, a micro-condensing plate shown in FIGS. 6A, 6B, 6C and 6D is produced by heat-treating a photoresist as described above. When pixels are further fined down, an aspect ratio in a photoresist pattern as shown in FIG. 6B needs to be further increased, and then such a photoresist pattern is difficult to be formed. Furthermore, Japanese Patent Application Laid-Open No. H06-118208 discloses a method for producing the micro-condensing plate by using a metal plating technique or a die, as another production method, but the process is complicated. In addition, when the method is applied to a photoelectric conversion apparatus, there is a concern that a defect formed by metal contamination increases noise. Furthermore, the patent does not describe wiring for reading signals out from a photoelectric conversion element or the like. Accordingly, there has been a room to further study configuration relationship among a wiring layer, a low refractive index region and a high refractive index region.

SUMMARY OF THE INVENTION

A method for producing a photoelectric conversion apparatus according to the present invention includes the steps of forming a plurality of wiring layers through interlayer insulation layers on a semiconductor substrate having a plurality of photoelectric conversion elements arranged thereon, forming an opening part of the interlayer insulation layer corresponding to the photoelectric conversion element, and forming an optical waveguide by filling the opening part with a high refractive index material having a higher refractive index than the interlayer insulation layer, wherein the step of forming the opening part in the interlayer insulation layer includes the steps of: forming a photoresist on the interlayer insulation layer; patterning the photoresist to form a photoresist pattern; transforming the photoresist pattern by reflow process; and forming the opening part by selectively etching a part of the interlayer insulation layer using the transformed photoresist pattern as a mask.

A method for producing a photoelectric conversion apparatus according to the present invention, which has a semiconductor substrate, a plurality of photoelectric conversion elements arranged on the semiconductor substrate, a plurality of wiring layers arranged on the semiconductor substrate through an interlayer insulation layer, and a high refractive index region which is arranged in an opening part of the interlayer insulation layer so as to correspond to the photoelectric conversion element and has a higher refractive index than the interlayer insulation layer includes the step of: forming the opening part by selectively etching the interlayer insulation layer while using a photoresist pattern transformed by reflow treatment as a mask.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

A photoelectric conversion apparatus according to the present invention has a plurality of photoelectric conversion elements arranged on a semiconductor substrate, and a plurality of wiring layers arranged on the substrate through an interlayer insulation layer. The photoelectric conversion apparatus further has an opening part arranged in the interlayer insulation layer so as to correspond to the photoelectric conversion element, and a high refractive index region which is arranged in the opening part and has a higher refractive index than the interlayer insulation layer. In such a photoelectric conversion apparatus, an area of a cross section parallel to a photoreceiving plane of the photoelectric conversion element in the high refractive index region increases as the position approaches to a light incident plane of the high refractive index region from the photoreceiving plane of the photoelectric conversion element, and the increasing rate continuously increases with the increase of the area.

When using an optical waveguide having such a shape, a photoelectric conversion apparatus can increase an amount of incident light, because an area of a cross section parallel to a photoreceiving plane of a photoelectric conversion element in the high refractive index region is largest in the light incident plane in the high refractive index region. The photoelectric conversion apparatus also can reduce color mixture, because of reducing the light incident on a space between optical waveguides.

In the optical waveguide, the sectional area continuously increases and the increasing rate continuously increases along with the increase of the sectional area, so that a shape of a cross section (side wall of optical waveguide) perpendicular to a photoreceiving plane of a photoelectric conversion element in an interlayer insulation layer shows a continuous curve. The optical waveguide having such a shape of the side wall has no flat part as shown in FIG. 5, and accordingly makes incident light more easily reflect toward the photoreceiving plane of the photoelectric conversion element. Even when oblique light is incident in the optical waveguide, the optical waveguide can make a more amount of lights reflect toward the photoreceiving plane of the photoelectric conversion element. Accordingly, when using a lens with a low F-number, which is particularly converts an incident light mainly into oblique light, a photoelectric conversion apparatus can reduce the lowering of sensitivity and can also reduce the lowering of sensitivity originating in the decrease of a light amount occurring in a peripheral part of a pixel.

Because the optical waveguide also has such a shape as a size of an opening part in the interlayer insulation layer decreases as the position approaches to a photoelectric conversion element side, flexibility for designing a wiring layer formed between interlayer insulation layers is improved. When designing the opening part, it is recommended to consider a design of the wiring layer to be arranged in the closest side to the photoelectric conversion element. By designing the opening part into such a shape, a photoelectric conversion apparatus can be further fined down, and can simultaneously have a wide opening for incident light, without making it difficult to design the wiring layer. Here, the wiring layer is an conductive layer made of wires or the like, but may be a patterned layer provided with a function of shielding light.

A production method according to the present invention includes a step of forming a plurality of wiring layers on a semiconductor substrate having a plurality of photoelectric conversion elements arranged thereon, through an interlayer insulation layer. The production method also includes the steps of: forming an opening part corresponding to the photoelectric conversion element in the interlayer insulation layer; and forming an optical waveguide in the opening part by filling the opening part with a high refractive index material having a higher refractive index than the interlayer insulation layer. Furthermore, the step of forming the opening part includes the steps of: forming a photoresist on the interlayer insulation layer; and forming a photoresist pattern by patterning the photoresist so as to correspond to a position of the opening part. The step of forming the opening part further includes the steps of: transforming the photoresist pattern by reflow treatment; and forming the opening part by selectively etching one part of the interlayer insulation layer while using the transformed photoresist pattern as a mask.

The above described method can form a desired shape more easily and more precisely than the production method according to Patent Document 2. The above described method can precisely form the desired shape by controlling an etching condition, even when a photoelectric conversion element will be further fined down and an aspect ratio of the shape increase. Accordingly, the above described method can precisely produce such a shape as the area of the cross section parallel to a photoreceiving plane of a photoelectric conversion element in a high refractive index region continuously increases as the position approach to a light-incident plane of an insulation layer from the photoreceiving plane of the photoelectric conversion element.

Here, it also becomes possible to reduce damage to a photoelectric conversion element during an etching step, by forming, on at least one part of the photoelectric conversion element, a layer made from a material having a property of being more hardly etched than that of an interlayer insulation layer.

Here, a semiconductor substrate which is a material substrate is referred to as "substrate", but the "substrate" includes the material substrate treated as will be now described below. For instance, a member in the state of having one or more semiconductor regions formed therein, a member in the middle of a series of production steps, or a member which has passed through a series of the production steps can be referred to as the substrate.

In addition, "on semiconductor substrate" means that something exists on a principal surface having pixels formed thereon of a semiconductor substrate. In addition, a direction toward the inside of the substrate from the principal surface of the semiconductor substrate shall be referred to as a lower direction, and the reverse direction shall be referred to as an upper direction.

(Circuit Configuration of Pixels)

Figure 9:
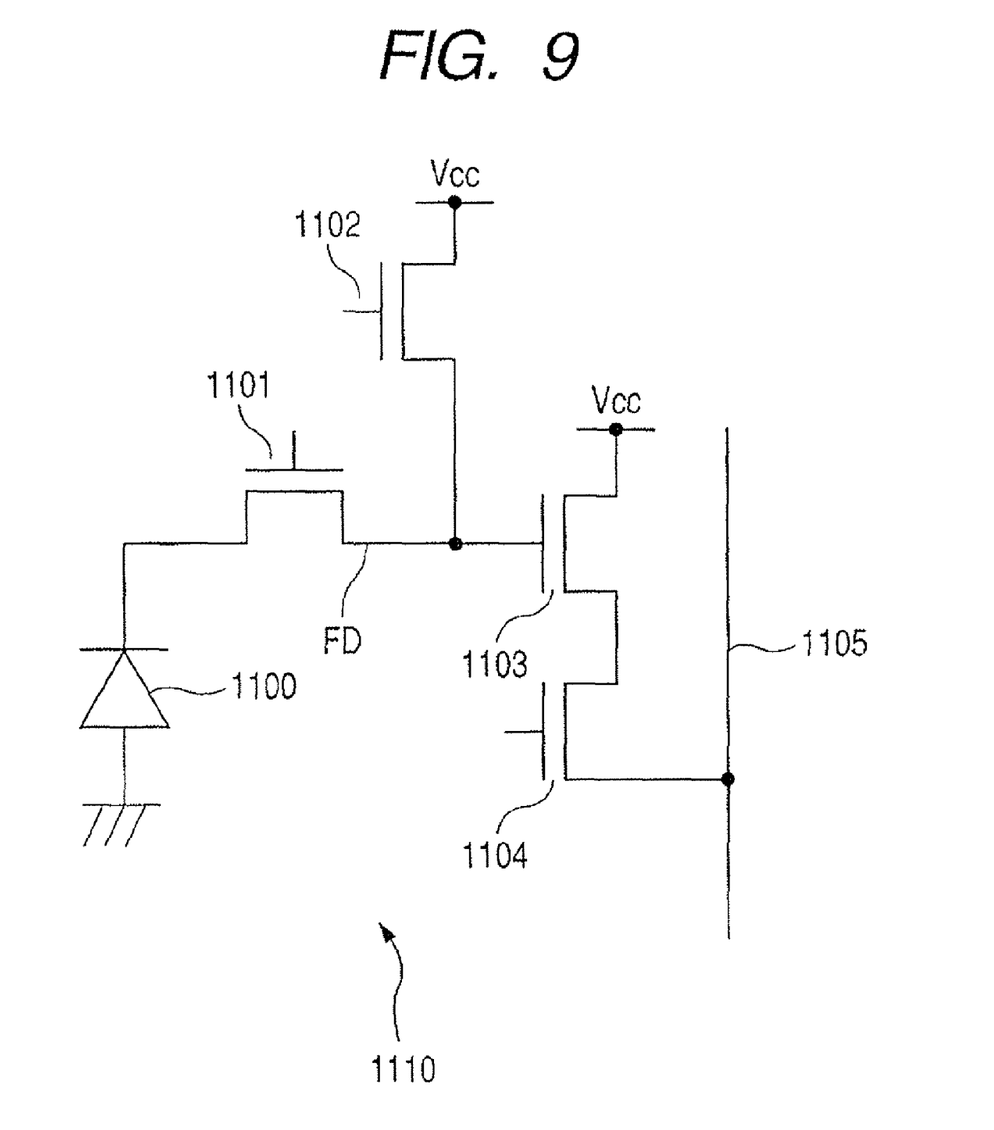
FIG. 9 is an example of an equivalent circuit of a photoelectric conversion apparatus.

FIG. 9 shows a MOS type photoelectric conversion apparatus as an example of a circuit configuration of pixels in a photoelectric conversion apparatus. The respective pixels are shown by 1110.

The pixel 1110 is composed of: a photodiode 1100 of a photoelectric conversion element; a transfer transistor 1101; a reset transistor 1102; an amplifying transistor 1103; and a selecting transistor 1104. In the figure, a power line is shown by Vcc and an output line is shown by 1105.

A photodiode 1100 has an anode connected to ground and a cathode connected to a source of a transfer transistor 1101. The source of the transfer transistor can serve also as the cathode of the photodiode.

A transfer transistor 1101 has a drain which composes a floating diffusion (hereafter referred to as FD) of a transfer region, and the gate is connected to a transfer signal line. A reset transistor 1102 has a drain which is connected to a power line Vcc, a source which composes FD, and a gate which is connected to a reset signal line.

An amplifying transistor 1103 has a drain which is connected to a power line Vcc, a source which is connected to the drain of a selecting transistor 1104, and a gate which is connected to FD. The selecting transistor 1104 has a drain which is connected to the source of the amplifying transistor 1103, a source which is connected to an output line 1105, and a gate which is connected to a vertical selecting line that is driven by a vertical selecting circuit (not shown).

A circuit configuration shown here is applicable not only to all embodiments according to the present invention, but also, for instance, to a configuration free from a transfer transistor, and other circuit configurations in which a plurality of pixels share a transistor. In addition, a photoelectric conversion element can employ not only a phototransistor but also a photodiode. In the next place, embodiments according to the present invention will be described in detail with reference to the accompanying drawings.

First Embodiment

Figure 1:
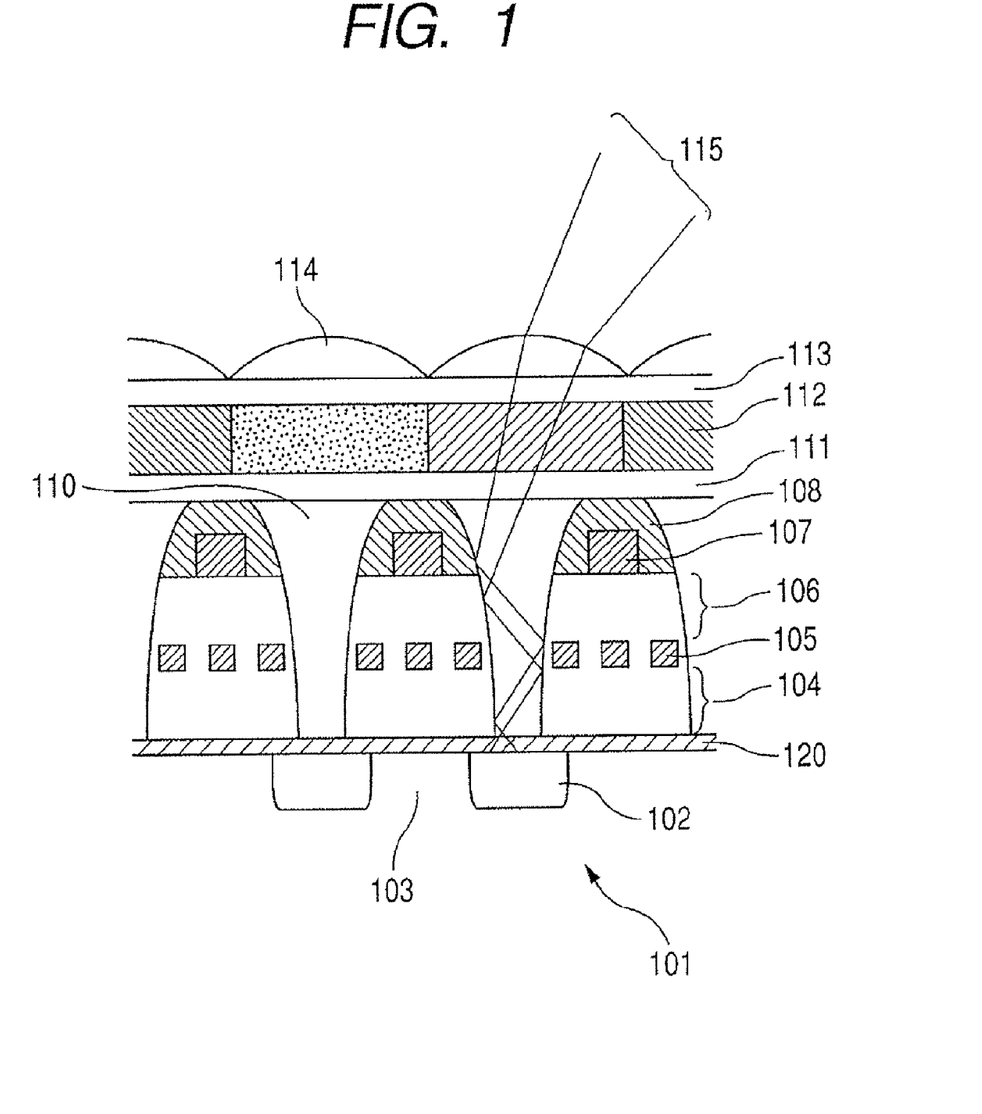
FIG. 1 is a sectional view of a photoelectric conversion apparatus in a first embodiment.

FIG. 1 is a schematic diagram of a cross section vertical to a semiconductor substrate of the above described MOS type photoelectric conversion apparatus.

In FIG. 1, reference numeral 101 denotes a semiconductor substrate, reference numeral 102 denotes a photoelectric conversion element arranged on the semiconductor substrate. Reference numeral 103 denotes an element isolation region arranged between two adjacent photoelectric conversion elements 102. Reference numeral 120 denotes an etching-stop layer for stopping etching in the step of forming an opening part. The etching-stop layer 120 has only to be arranged at least on the photoelectric conversion element, but is arranged on the whole surface of the semiconductor substrate 101 in the present embodiment. Reference numeral 104 denotes the first insulation layer which is an interlayer insulation layer. In the case of a CMOS type photoelectric conversion apparatus, a gate electrode is formed on the semiconductor substrate, but is omitted here.

Reference numeral 105 denotes a wiring layer which is arranged on the first insulation layer 104. Reference numeral 106 denotes the second insulation layer which is the interlayer insulation layer and is arranged so as to cover the first patterned layer 105. Reference numeral 107 denotes a third wiring layer which is arranged on the second insulation layer. Reference numeral 108 denotes a protective layer which is arranged on the second wiring layer 107.

A high refractive index region 110 having a higher refractive index than an interlayer insulation layer is further arranged in an opening part of the interlayer insulation layer consisting of first and second insulation layers 104 and 106 on a photoelectric conversion element 102. Thus formed optical waveguide reflects light on an interface between the high refractive index region 110 and an interlayer insulation layer. Here, when a photoelectric conversion apparatus employs a material having a refractive index equivalent to the interlayer insulation layer for a protective layer 108, it can form the optical waveguide which reflects light on the interface between the protective layer 108 and the high refractive index region 110.

Then, an intermediate layer 111 is arranged on a protective layer 108, and further a color filter layer 112, a planarization layer 113 and a micro lens 114 are arranged on the intermediate layer 111 in that order. Here, the intermediate layer 111 is a planarization layer, an anti-reflection coating, a light-shielding film or the like.

Figure 2A:
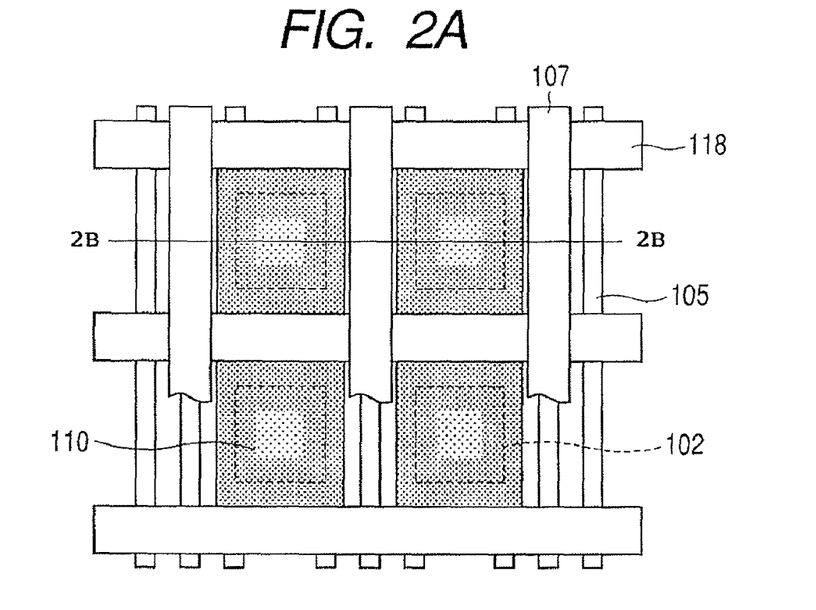
FIG. 2A is a top view of a photoelectric conversion apparatus in a first embodiment.
Figure 2B:
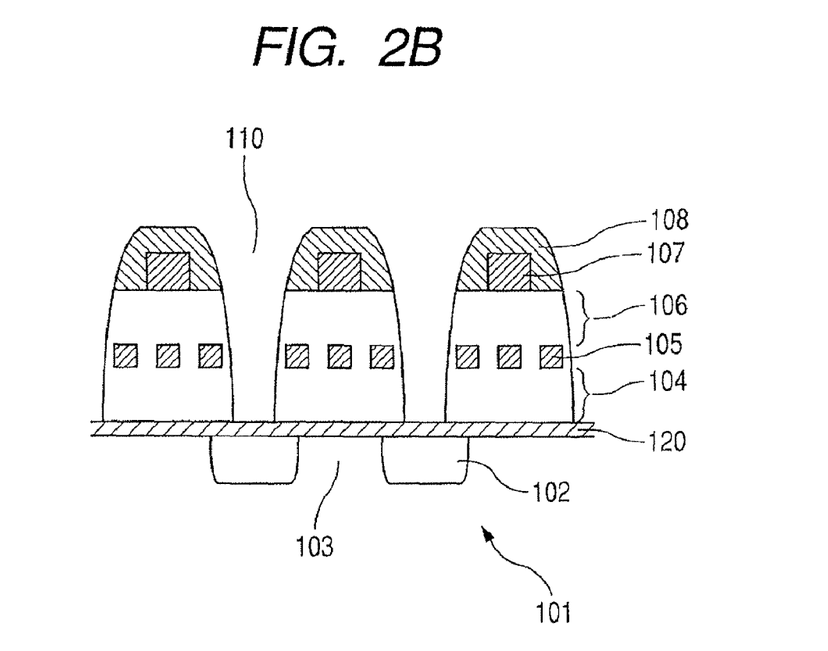
FIG. 2B is a sectional view of a photoelectric conversion apparatus in a first embodiment along line 2B-2B in FIG. 2A.

In the next place, schematic diagrams of cross sections parallel and vertical to a semiconductor substrate of a MOS type photoelectric conversion apparatus shown in FIG. 1 are shown in FIGS. 2A and 2B respectively.

FIG. 2A is a diagrammatic projection view of a plane parallel to a semiconductor substrate of an MOS type photoelectric conversion apparatus. A region of a photoelectric conversion element 102 is shown by a dotted line, and reference numeral 105 denotes the first pattern, reference numeral 118 denotes the second pattern and reference numeral 107 denotes the third pattern. A part of the third pattern 107 is omitted so that a layer below the third pattern can be easily understood. Furthermore, reference numeral 110 denotes a high refractive index region. In addition, a schematic diagram of a cross section in a line 2B-2B in FIG. 2A is shown in FIG. 2B. In the figure, a color filter layer 112 shown in FIG. 1 is omitted.

A cross section parallel to a photoreceiving plane of a photoelectric conversion element of a high refractive index region 110 shown in this FIG. 2A has a shape of continuously increasing as the position approaches to a light-incident plane of an interlayer insulation layer from a photoelectric conversion element 102. The shape enables the amount of incident light to increase.

A cross section vertical to a photoreceiving plane of a photoelectric conversion element 102 in an opening part of an interlayer insulation layer shown in FIG. 2B, namely, a side wall of a high refractive index region 110 has a continuous curve shown in the figure. The above shape can reflect more oblique incident light toward the photoreceiving plane of the photoelectric conversion element than a shape as shown in FIG. 5, and accordingly improves condensing efficiency.

The above described shape can further make a photoelectric conversion apparatus adopt a configuration in which the first wiring layer 105 has higher wiring density than the third wiring layer 107, for instance, as shown in the drawing of FIG. 1. In other words, the photoelectric conversion apparatus can more freely design a wiring layer particularly the first wiring layer 105 formed on the side of a photoelectric conversion element 102, and can more easily cope with the tendency of fining down.

Figure 3A:
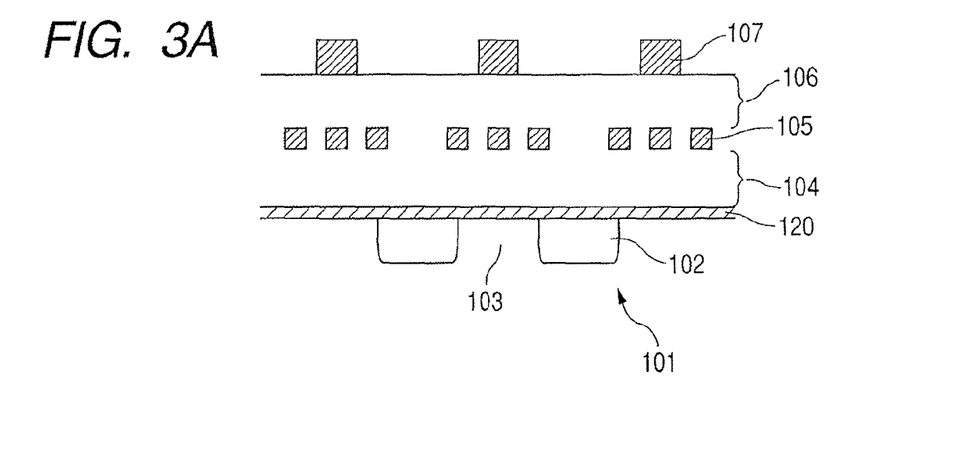
FIGS. 3A, 3B, 3C, 3D, 3E, 3F, 3G, 3H and 3I are steps of producing a photoelectric conversion apparatus in a first embodiment.

In the next place, a method for producing a photoelectric conversion apparatus according to the present embodiment will be described with reference to FIGS. 3A, 3B, 3C, 3D, 3E, 3F, 3G, 3H and 3I. Wherein, the second wiring layer 118 is not shown in the drawings. And, a producing step of the second wiring layer 118 has been omitted. An element isolation region 103 is formed on a semiconductor substrate 101 with a LOCOS method or the like, as is shown in FIG. 3A. Then, a photoresist pattern is formed on the semiconductor substrate 101, and a photoelectric conversion element 102 is formed in the semiconductor substrate 101 by ion implantation and heat treatment. Wherein, elements such as MOS transistor are formed. Detailed description thereof has been omitted.

Subsequently, an etching-stop layer 120 is formed on a semiconductor substrate 101 with a CVD technique or the like, and the first insulation layer 104 made from SiO or a material containing SiO as the main component is further formed on the etching-stop layer 120. Here, it becomes possible to improve patterning precision in the following step by planarization the surface of the first insulation layer 104 with a chemical mechanical polishing technique or the like.

On the first insulation layer 104, a metallic layer made from Al, Mo, W, Ta, Ti, Cu or an alloy containing them as main components is formed with a sputtering technique or the like, and the first wiring layer 105 is formed by patterning the metallic layer.

Subsequently, the second insulation layer 106 made from SiO or a material containing SiO as a main component is formed on the first insulation layer 104 and the first wiring layer 105. Then, the third wiring layer 107 is formed on the second insulation layer 106 with the same method as in the case of the first wiring layer.

Here, the first and third wiring layers 105 and 107 function not only as a wiring to be used for transmitting an electrical signal sent from a photoelectric conversion element 102, but also as a light-shielding portion for preventing light to be incident on a certain photoelectric conversion element 102 from being incident on another photoelectric conversion element 102.

Figure 3B:
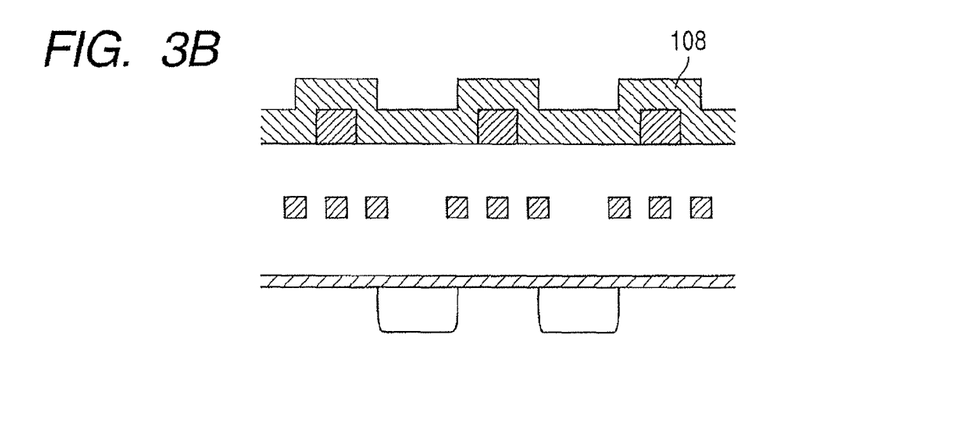
Figure 3C:
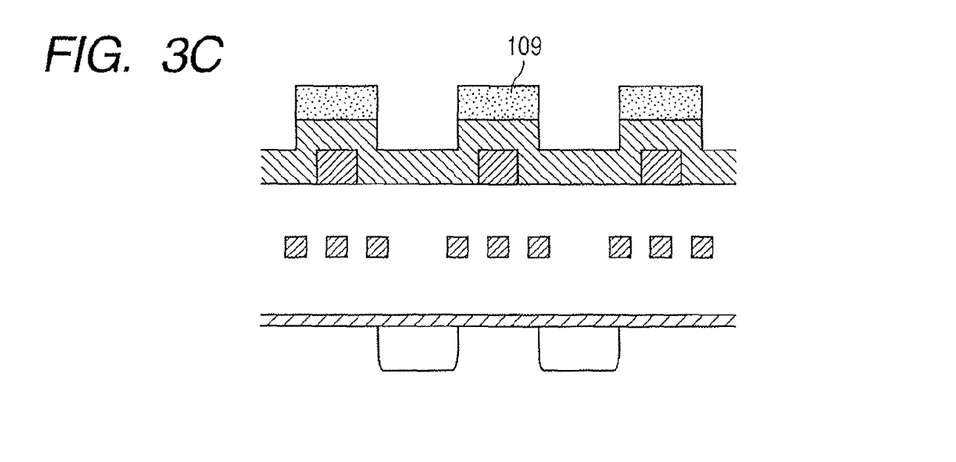
Figure 3D:
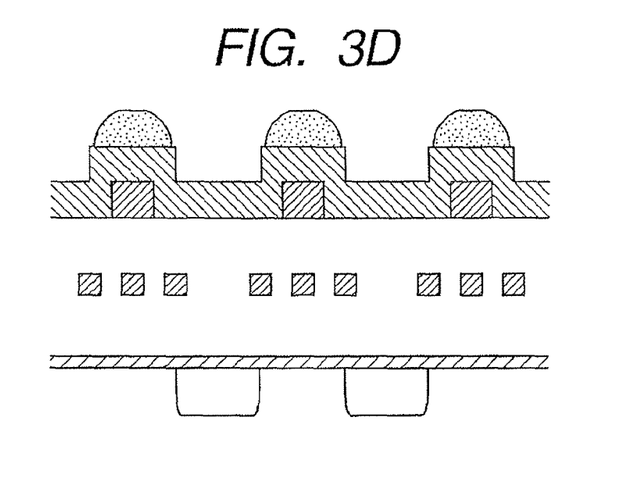

Subsequently, a protective layer 108 made from SiO, SiN, SiON or the like is formed as is shown in FIGS. 3B, 3C and 3D. In FIGS. 3B, 3C and 3D, the protective layer 108 has an uneven part, but they only illustrate such a state as the protective layer 108 reflects the shape of the third wiring layer 107 while emphasizing it, so that the protective layer 108 may also be planar.

Figure 3E:
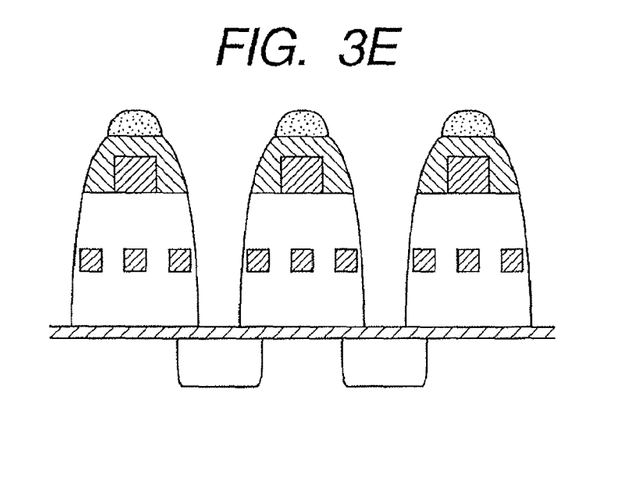

On a protective layer 108, an etching mask is formed for forming an opening part right above a photoelectric conversion element 102, as is shown in FIG. 3C. At first, a photoresist pattern 109 is formed on the protective layer 108. The photoresist pattern 109 coincides with the shape of a salient of the protective layer 108 in the figure, but the figure is drawn into an emphasized shape as was described above, so that the photoresist pattern is not limited by the shape and the arrangement. The opening part has only to be appropriately arranged so as to correspond to a photoelectric conversion element 102. Subsequently, the photoresist pattern 109 is formed such a shape as is shown in FIG. 3D by the refolw process. By the heat treatment, the photoresist pattern 109 acquires a shape like a part of a ball or a convex. Subsequently, the protective layer and the insulation layer are etched toward the photoelectric conversion element 102 from the surface, while using the photoresist pattern 109 formed by the reflow process as an etching mask, as is shown in FIG. 3E. When the etching is stopped at an etching-stop layer 120, an opening part of an interlayer insulation layer according to the present embodiment, namely, the shape of an optical wave guide is obtained. A condition for the etching step is set at a condition in which the etching-stop layer 120 is more hardly etched than the interlayer insulation layer. In other words, an etching rate of the etching-stop layer 120 is sufficiently smaller than the etching rates of the first and second insulation layers 104 and 106, which are the interlayer insulation layers.

The shape of an opening part of an interlayer insulation layer formed at this time can be controlled by adjusting the shape of a photoresist pattern 109 which is formed by reflow process and is used as an etching mask, an etching condition and a ratio on etching easiness of the interlayer insulation layer to a resist. As a result, the opening part with a high aspect ratio can be controllably etched and a desired shape can be obtained. In addition, it is preferable that an area of the opening part closest to a photoelectric conversion element 102, namely, an area of the bottom of an optical waveguide is smaller than that of a light receiving portion of the photoelectric conversion element 102. The configuration increases the efficiency for a reflected light by the optical waveguide to be incident on the photoelectric conversion element 102.

Figure 3F:
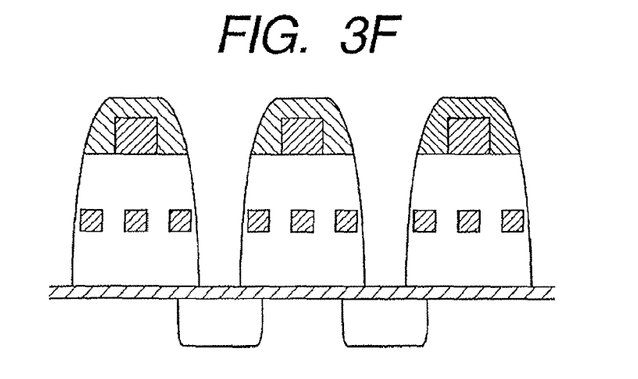
Figure 3G:
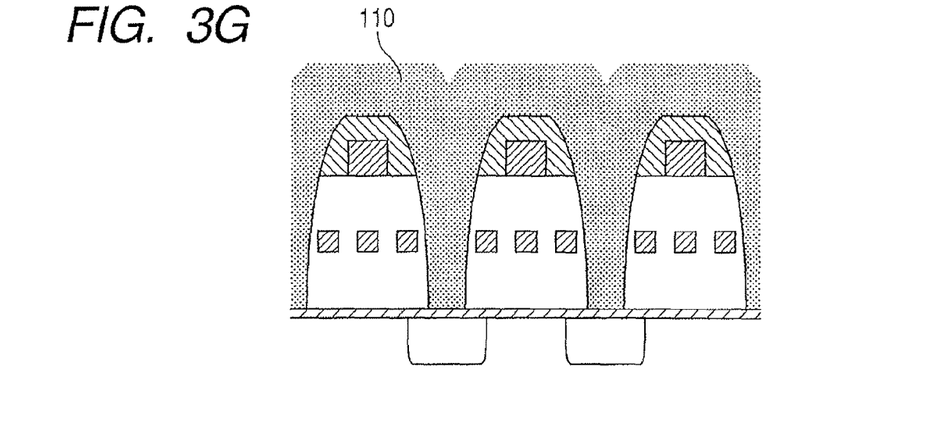

Subsequently, a photoresist pattern 109 is eliminated, and an opening part in an interlayer insulation layer is filled with a high refractive index material by a CVD technique to form a high refractive index region 110 (see FIGS. 3F and 3G). This high refractive index material is one having larger refractive index than that of the interlayer insulation layer.

Figure 3H:
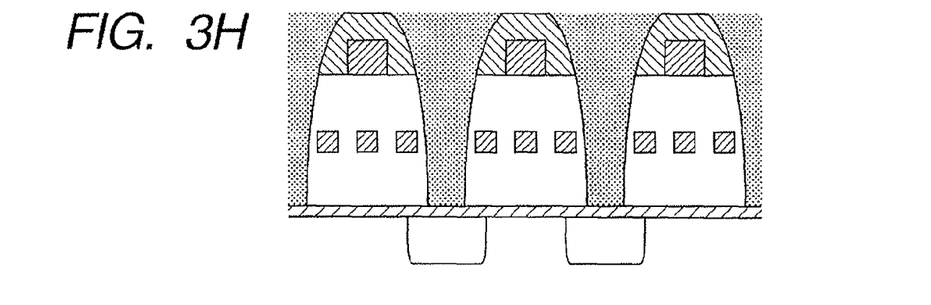

As is shown in FIG. 3H, a high refractive index region 110 is planarized by a chemical mechanical polishing technique or an etch-back technique with the use of plasma etching. By the planarization operation, a shape in the following step can be controlled. In the above planarization step, the chemical mechanical polishing technique is preferably used to the etchback technique, because of causing little plasma damage in a photoelectric conversion element 102, which may increase a dark current and a pixel defect.

Though a planarization operation was finished when the planarized surface reached a protective layer 108 in the present embodiment, the operation can also be stopped before the planarized surface reaches the protective layer 108 and when the planarized surface is already in a high refractive index region 110. In this case, it is possible to omit a step of forming the protective layer 108 shown in FIG. 3B and make the high refractive index region 110 also serve as the protective layer.

Figure 3I:
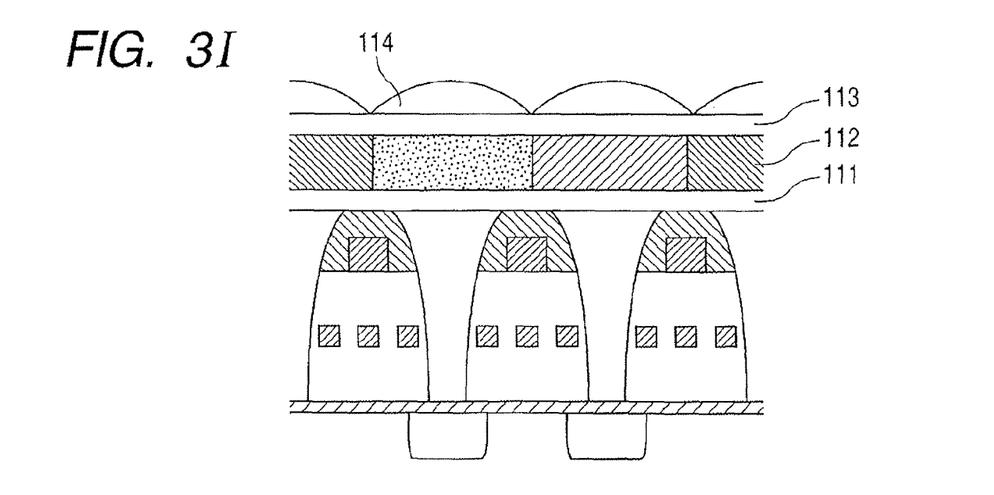

Finally, an intermediate layer 111 made from a resin or the like, a color filter layer 112 and a planarization layer 113 are sequentially formed, and a micro lens 114 is formed, as is shown in FIG. 3I.

An optical waveguide having the shape according to the present embodiment has a wide incident plane and increased condensing efficiency. The optical waveguide also can decrease a light incident on a space between the optical waveguides from leaking into adjacent pixels after having been reflected on the protective layer 108, a wiring layer and a color filter layer 112.

Furthermore, the optical waveguide has such a shape as an area of a cross section of a high refractive index region parallel to a photoreceiving plane of a photoelectric conversion element becomes smaller in a photoelectric conversion element side, which increases a degree of freedom when designing a wiring layer formed in an interlayer insulation layer. The shape can increase the degree of the freedom particularly in designing for the wiring layer formed in the photoelectric conversion element side. Accordingly, it becomes possible to form a wide opening for incident light even when the opening in the photoelectric conversion element side is narrowed for forming the wiring layer along with fining down of a photoelectric conversion apparatus, and to increase condensing efficiency.

Second Embodiment

Figure 4:
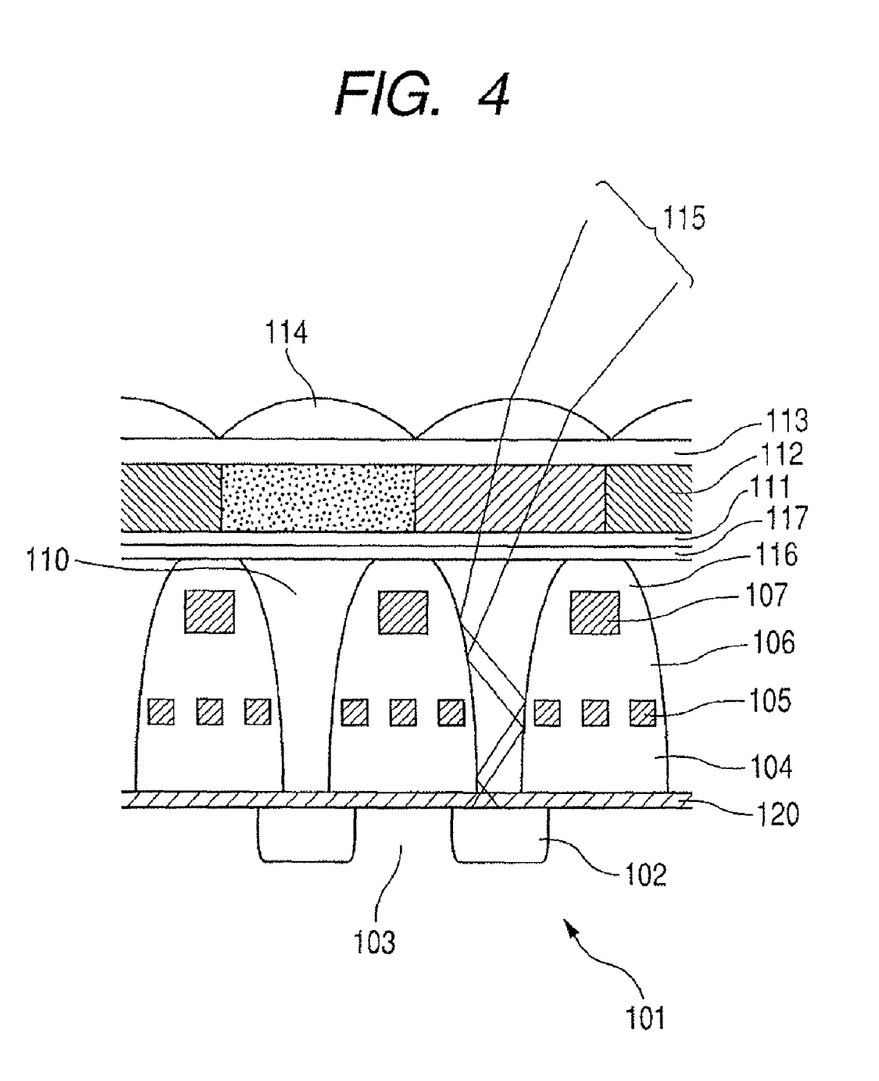
FIG. 4 is a sectional view of a photoelectric conversion apparatus in the second embodiment.

FIG. 4 is a schematic block diagram of a cross section of a photoelectric conversion element portion in a photoelectric conversion apparatus. A configuration concerning on a protective layer differs from that in a first embodiment. In the present embodiment, the third insulation layer 116 is arranged so as to cover the third wiring layer 107, and a protective layer 117 made from, for instance, SiN is arranged on the upper part of the third insulation layer 116. The third insulation layer 116 has a SiO layer, for instance, and the protective layer 117 has a SiN layer, for instance. At this time, a refractive index of a high refractive index region 110 is greatly different from that of the third insulation layer 116, so that an amount of light reflected on the interface between them in the upper part of the third wiring layer 107 increases to improve condensing efficiency. Furthermore, the protective layer 117 is flatly formed due to a configuration of arranging the protective layer 117 on the upper part of the high refractive index region 110 and the third insulation layer 116. In addition, the protective layer 117 is planar in the present embodiment, so that a hydrogen-termination of a semiconductor substrate can be made uniformly at the SiN layer of the protective layer 117.

(Application to Image Pickup Module)

Figure 7:
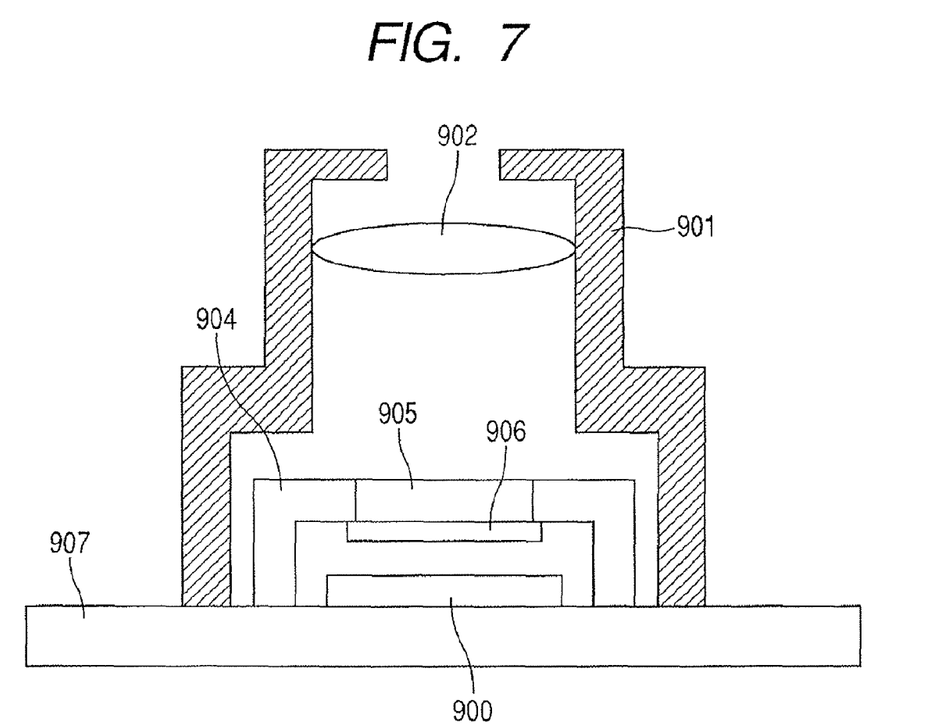
FIG. 7 is a block diagram of an image pickup module of an example having used a photoelectric conversion apparatus.

FIG. 7 is a block diagram of one example of having applied a photoelectric conversion apparatus described in first and second embodiments according to the present invention to an image pickup module to be used in portable equipment.

A photoelectric conversion apparatus 900 is placed on a substrate 907 made from ceramic or the like, and a cover member 904 for sealing is placed above the photoelectric conversion apparatus 900. The substrate 907 is electrically connected to the photoelectric conversion apparatus 900. Above the photoelectric conversion apparatus 900, an optical lowpass filter 906 and an optical part 905 that collects light are placed. Furthermore, an imaging lens 902 and a lens-barrel 901 for fixing the imaging lens 902 cover a cover member 904 and tightly seal the inner part while cooperating with the substrate 907.

In the present application, an imaging signal processing circuit, an A/D converter (analog-to-digital converter) and a module control unit may be mounted on a substrate 907 as well as a photoelectric conversion apparatus according to the present invention. In addition, they may also be formed in one step on the same semiconductor substrate (reference numeral 101 shown in FIG. 1) as the photoelectric conversion apparatus is mounted.

(Application to Image Pickup System)

Figure 8:
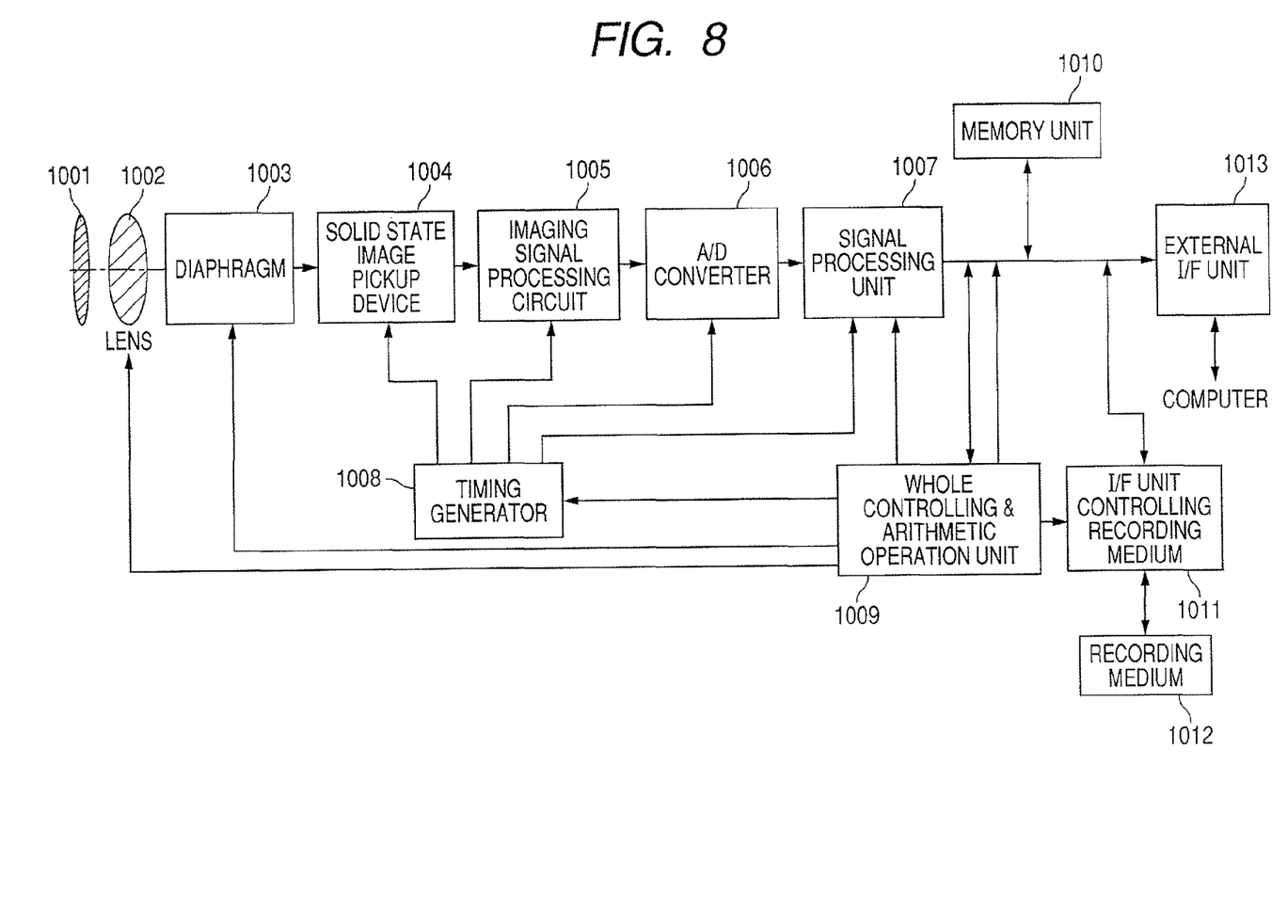
FIG. 8 is a block diagram showing a configuration of a digital camera of an example having used a photoelectric conversion apparatus.

FIG. 8 is a block diagram of one example of having applied a photoelectric conversion apparatus described in first and second embodiments according to the present invention to a digital camera which is an example of an image pickup system. The image pickup system includes a camcorder or the like in addition to the digital camera.

The digital camera arranges a shutter 1001, an imaging lens 1002 and a diaphragm 1003 therein as a structure for taking light into a solid-state image pickup device 1004 which is a photoelectric conversion apparatus. The shutter 1001 controls light to be incident on a solid-state image pickup device 1004, and the incident light forms an image on the solid-state image pickup device 1004 through the imaging lens 1002. At this time, an amount of the light is controlled by the diaphragm 1003.

A solid-state image pickup device 1004 outputs a signal in accordance with taken light, an imaging signal processing circuit 1005 processes the signal, and an A/D converter 1006 converts the analog signal to a digital signal. Then, a signal processing unit 1007 arithmetically processes the output digital signal to produce imaged picture data. The imaged picture data can be stored in a memory 1010 mounted in a digital camera, in accordance with setting for an operation mode by a user, and can be transmitted to external equipment such as a computer and a printer through an external I/F unit 1013. It is also possible to record the imaged picture data in a recording medium 1012 which is detachable from and attachable to the digital camera, through an I/F unit controlling recording medium 1011.

A timing generator 1008 controls a solid-state image pickup device 1004, an imaging signal processing circuit 1005, an A/D converter 1006 and a signal processing unit 1007, and in addition, a whole controlling & arithmetic operation unit 1009 controls the whole system. It is also possible to form these systems in one step on the same semiconductor substrate (reference numeral 101 shown in FIG. 1) having the solid-state image pickup device 1004 formed thereon.

As described above, the photoelectric conversion apparatus can efficiently condense an incident light in a photoelectric conversion element, because an optical waveguide can secure a large width of a light-incident plane. The photoelectric conversion apparatus can also improve flexibility in designing a pattern, because the optical waveguide can narrow its width in the photoelectric conversion element side.

The above facts are useful in further fining the photoelectric conversion apparatus down. Furthermore, the photoelectric conversion apparatus can efficiently condense the oblique incident light onto the photoelectric conversion element, and accordingly, even when using a lens with a low F-number, can reduce the lowering of sensitivity and can also reduce the lowering of sensitivity originating in the decrease of a light amount occurring in a peripheral part of a pixel.

An optical waveguide with a shape of high condensing efficiency can be easily formed by a production method which uses a reflow-treated photoresist as an etching mask. It also becomes possible to form the shape more controllably.

As described above, the present invention can produce a photoelectric conversion apparatus having improved sensitivity and can provide it. In addition, the production method according to the present invention is not limited to a form shown in the embodiments, but can be applied to a photoelectric conversion apparatus having many wiring layers and insulation layers arranged therein.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-365006, filed Dec. 19, 2006, which is hereby incorporated by reference herein in its entirety.

What is claimed is:

1. A method for producing a photoelectric conversion apparatus, the method comprising:
    forming an interlayer insulation layer on a semiconductor substrate having a plurality of photoelectric conversion elements arranged thereon,
    forming an opening part of the interlayer insulation layer corresponding to the photoelectric conversion element, and
    forming a optical wave guide by filling the opening part with a high refractive index material having a higher refractive index than the interlayer insulation layer,
    wherein the forming the opening part of the interlayer insulation layer includes:
        forming a photoresist layer on the interlayer insulation layer;
        patterning the photoresist layer to form a photoresist pattern;
        transforming the photoresist pattern by a reflow process; and
        forming the opening part by selectively etching a part of the interlayer insulation layer using the transformed photoresist pattern as a mask.

2. The method for producing a photoelectric conversion apparatus according to claim 1, further comprising planarizing the optical waveguide and the insulation layer with a chemical mechanical polishing technique after finishing the forming of the optical wave guide.

3. The method for producing a photoelectric conversion apparatus according to claim 1, wherein the interlayer insulation layer includes SiO.

4. The method for producing a photoelectric conversion apparatus according to claim 1, further comprising forming an etching-stop layer on the semiconductor substrate, before the forming of the interlayer insulation layer.

5. The method for producing a photoelectric conversion apparatus according to claim 3, wherein the etching-stop layer is arranged at least on the photoelectric conversion element.

6. The method for producing a photoelectric conversion apparatus according to claim 1, further comprising forming a plurality of wiring layers through the interlayer insulation film on the semiconductor substrate.

7. The method for producing a photoelectric conversion apparatus according to claim 6, further comprising forming a protective layer on an upper wiring layer of the plurality of wiring layers, before the forming of the opening part.

8. The method for producing a photoelectric conversion apparatus according to claim 7, wherein the protective layer is formed from at least one of: SiO, SiN, and SiON.

9. The method for producing a photoelectric conversion apparatus according to claim 1, further comprising forming a protective layer on the optical wave guide.

10. The method for producing a photoelectric conversion apparatus according to claim 9, wherein the protective layer is formed from at least one of: SiO, SiN, and SiON.

11. The method for producing a photoelectric conversion apparatus according to claim 1, further comprising forming a color filter layer above the optical wave guide.

12. The method for producing a photoelectric conversion apparatus according to claim 1, further comprising forming a micro lens above the optical wave guide.

13. The method for producing a photoelectric conversion apparatus according to claim 1, wherein a side wall of the opening part has a continuous curve in a cross section perpendicular to a photoreceiving plane of the photoelectric conversion element.

14. A method for producing a photoelectric conversion apparatus that includes:
    a semiconductor substrate,
    a plurality of photoelectric conversion elements arranged on the semiconductor substrate,
    a plurality of wiring layers arranged on the semiconductor substrate through an interlayer insulation layer, and
    a high refractive index region which is arranged in an opening part of the interlayer insulation layer so as to correspond to the photoelectric conversion element and has a higher refractive index than the interlayer insulation layer,
    the method comprising:
        forming the opening part by selectively etching the interlayer insulation layer while using as a mask a photoresist pattern transformed by a reflow treatment.

* * * * *